United States Patent
Hamaishi et al.

(10) Patent No.: US 7,615,983 B2
(45) Date of Patent: Nov. 10, 2009

(54) HIGH FREQUENCY POWER DEVICE FOR PROTECTING AN AMPLIFYING ELEMENT THEREIN

(75) Inventors: Satoru Hamaishi, Osaka (JP); Yoshiki Fukumoto, Osaka (JP); Kazutaka Sei, Osaka (JP)

(73) Assignee: Daihen Corporation, Osaka (JP)

( * ) Notice: Subject to any disclaimer, the term of this patent is extended or adjusted under 35 U.S.C. 154(b) by 221 days.

(21) Appl. No.: 11/536,171

(22) Filed: Sep. 28, 2006

(65) Prior Publication Data

US 2007/0076344 A1 Apr. 5, 2007

(30) Foreign Application Priority Data

Sep. 30, 2005 (JP) ............................. 2005-289437

(51) Int. Cl.
*G05F 1/00* (2006.01)
(52) U.S. Cl. ..................... 323/285; 323/283; 323/284
(58) Field of Classification Search ................. 323/22, 323/282–284, 907, 285
See application file for complete search history.

(56) References Cited

U.S. PATENT DOCUMENTS

2002/0158622 A1* 10/2002 Rayne et al. ............. 324/76.53
2002/0175722 A1* 11/2002 Mano et al. .................. 327/156
2005/0240101 A1* 10/2005 Kato et al. ................... 600/437
2006/0220573 A1   10/2006 Kotani et al.
2007/0089525 A1*  4/2007 Momose et al. .............. 73/753
2007/0121267 A1*  5/2007 Kotani et al. ................. 361/85

FOREIGN PATENT DOCUMENTS

JP  2003-143861  5/2003

OTHER PUBLICATIONS

English Language Abstract of JP 2003-143861.
U.S. Appl. No. 11/467,228 to Kotani et al., filed Aug. 25, 2006.

* cited by examiner

*Primary Examiner*—Edward Tso
*Assistant Examiner*—Arun Williams
(74) *Attorney, Agent, or Firm*—Greenblum & Bernstein P.L.C.

(57) ABSTRACT

A high frequency power device includes a first oscillator outputting a first oscillating signal oscillated by a first predetermined frequency and a second oscillator outputting a second oscillating signal oscillated by a second predetermined frequency. A phase adjuster adjusts the phase of the second oscillating signal and a modulation index adjuster adjusts a modulation index of the second oscillating signal. A modulator outputs a modulated signal obtained by modulating, in frequency, the first oscillating signal by the phase adjusted and modulated second oscillating signal, and a high frequency output unit amplifies and outputs the modulated signal outputted from the modulator.

9 Claims, 8 Drawing Sheets

HIGH FREQUENCY POWER DEVICE FOR PROTECTING AN AMPLIFYING ELEMENT THEREIN

BACKGROUND OF THE INVENTION

1. Technical Field of the Invention

The present invention relates to a high frequency power device for supplying an electric power to a load such as a plasma processor for performing, for instance, a plasma etching and a plasma CVD.

2. Description of the Related Art

As a plasma processing system for processing (a plasma etching, a plasma CVD, etc.) an object to be processed such as a wafer, a liquid crystal substrate or the like by using a plasma generated by the use of a high frequency power, a plasma processing system using the high frequency power of different frequencies is known as shown in FIG. 6.

FIG. 6 is a block diagram showing the connecting relation of the plasma processing system using the high frequency power of the different frequencies.

In FIG. 6, a usual first high frequency power device 50 is a power device for supplying a first high frequency power (refer it to as a first high frequency, hereinafter) to a load 5 through a transmitting line 2, a first matching device 3 and a connecting part 4. An output frequency of the first high frequency power device 50 is designated by a first frequency f1 and a period of the first frequency is designated by t1. Further, a second high frequency power device 6 is a power device for supplying a second high frequency power (refer it to as a second high frequency, hereinafter) to the load 5 through a transmitting line 7, a matching device 8 and a connecting part 9 to the load 5. An output frequency of the second frequency power device 6 is designated by a second frequency f2 and the period of the second frequency is designated by t2. The first frequency is higher than the second frequency. For instance, as the first frequency, the frequency such as 13.56 MHz, 27.12 MHz, 40.68 MHz. etc. is employed. Further, as the second frequency, the frequency such as 400 kHz, 2 MHz etc. is used. In such a way, the high frequency power devices of this type ordinarily output the high frequency power of the frequency not lower than several hundred kHz.

The first high frequency outputted from the first high frequency power device 50 mainly serves to generate a plasma in the load 5. Further, the second high frequency outputted from the second high frequency power device 6 is used for a bias for efficiently performing a process (a plasma etching, plasma CVD, etc.) in the load 5. Two kinds of high frequencies outputted from the two high frequency power devices are superimposed and the superimposed high frequencies are applied to an electrode in the load 5.

To control the outputs of the high frequency power devices, a method for controlling forward wave powers respectively outputted therefrom to prescribed levels or a method for controlling a load side power obtained by subtracting a reflected wave power from the forward wave power to a prescribed level are employed.

Now, the high frequency power device 50, the matching device 3 and the load 5 will be mainly described below.

The matching device 3 is a device used for the purpose of matching impedance between the high frequency power device and the load 5 by matching a power source side impedance Zo (ordinarily, 50Ω) looking toward the high frequency power device 50 side from the input end 301 of the matching device 3 via the transmitting line 2 with a load side impedance ZL (the impedance of the matching device 3, the connecting part 4 to the load 5 and the load 5) looking toward the load 5 side from the input end of the matching device 3.

The matching device 3 includes a variable impedance element not shown in the drawing (for instance, a variable condenser, a variable inductor, etc.) therein and has a function for changing the impedance of the variable impedance element so as to match the impedance between the high frequency power device 50 and the load 5. More specifically, assuming that an impedance (an output impedance) looking toward the high frequency power device 50 side from an output end 501 of the high frequency power device 50 is designed to have, for instance, 50Ω, and the high frequency power device is connected to the input end of the impedance matching device 3 in the transmitting line 2 having the characteristic impedance of 50Ω, the impedance matching device 3 changes the impedance of the variable impedance element so as to convert the load side impedance ZL looking toward the load 5 side from the input end 301 of the impedance matching device 3 to 50Ω.

The load 5 is generally called a plasma processor and is a device having a chamber provided with electrodes therein to process or work (etching, CVD, or the like) an object to be processed such as a wafer or a liquid crystal substrate conveyed into the chamber. The load 5 introduces plasma discharging gas into the chamber to process or work the object to be processed and applies the high frequency power (voltage) supplied from the two high frequency power devices to the electrodes therein to generate a high frequency electric field between the electrodes, discharge the plasma discharging gas and obtain a plasma state. Then, this plasma is employed to process the object to be processed.

Now, the structure of the high frequency power device 50 will be described below.

FIG. 7 is a block diagram showing a structural example of an ordinary high frequency power device. An amplifying part 52 uses a DC power supplied from a DC power source part 51 to amplify an oscillating signal Vin outputted from an oscillating part 59 and output a high frequency power having an output frequency of a radio frequency band. The high frequency power amplified in the amplifying part 52 is supplied to the load 5 through a filter part 53 for mainly removing higher harmonics and a directional coupler 54. Further, a forward wave power value Pf is calculated in a forward wave power calculating part 55 in accordance with a forward wave voltage detected in the directional coupler 54. An output power control part 58 compares an output power setting value Pset of the high frequency power set in an output power setting part 57 with the forward wave power value Pf calculated in the forward wave power calculating part to control the output level of the oscillating signal Vin of the oscillating part so that both the values are equal to each other. That is, the output power control part controls the output level of the oscillating signal Vin of the oscillating part to control the output of the high frequency power to be constant. The high frequency power device may be constructed in such a way that a reflected wave power value Pr is calculated from a reflected wave voltage detected in the directional coupler 54 and a calculated load side power value obtained by subtracting the calculated reflected wave power value Pr from the calculated forward wave power value Pf is controlled to be constant. Such a high frequency power device is disclosed in JP-A-2003-143861.

FIG. 8 is an image diagram when the plasma is generated in the chamber of the load 5. As shown in FIG. 8, when the high frequency power (voltage) is applied to the electrodes in the chamber from the two high frequency power devices to generate the plasma, an electric conductive plasma and an insulating sheath are formed between the electrodes. In FIG. 8, a rectangular figure surrounding the periphery of the plasma is represented as an earth side electrode.

FIG. 9 shows an electric equivalent circuit of the load 5 when the plasma is generated in the chamber. As described above, since the plasma is electric conductive and the sheath has insulating characteristics, a loss part in the plasma can be expressed as a resistance and the sheath can be expressed as a condenser as shown in FIG. 9.

Now, a state will be described when a plurality (for instance, two) of high frequency power devices 50 and 6 having different output frequencies supply the high frequency power to one load 5 by using the electric equivalent circuit shown in FIG. 9.

Ordinarily, when the two high frequency power devices are used, a second high frequency (second frequency) for a bias is lower than a first high frequency (first frequency). In such a case, when there is a large difference between the output frequencies of the two high frequency power devices, the second high frequency causes a large reflected wave to be generated in the first high frequency power device 50 side.

Specifically, as shown in the equivalent circuit in FIG. 9, when the sheath is considered to be the condenser, the voltage across the condenser changes due to the influence of the high frequencies outputted from both the high frequency power devices 50 and 6. However, since the first frequency is higher than the second frequency, the voltage across the condenser changes as if the voltage were modulated by the second frequency. Consequently, the thickness of the sheath varies in the same period as that of the second frequency. When this phenomenon is considered in the equivalent circuit shown in FIG. 9, the phenomenon corresponds to the change of a distance between the electrodes of the condenser. Therefore, the capacity of the condenser changes.

Further, since the state of the plasma varies together with the change of the state of the sheath, the impedance of the load 5 changes as if the impedance were modulated by the second frequency. Accordingly, since a part of a forward wave outputted from the first high frequency power device 50 is reflected due to the influence of the modulation having the same period as that of the second frequency, the reflected wave is generated.

At this time, the first matching device 3 may conveniently match the impedance following the modulation of the second frequency. However, as described above, since the first matching device 3 drives the variable impedance element (for instance, the variable condenser, the variable inductor, etc.) to match the impedance, the first matching device cannot follow a high speed change such as the modulation of the second frequency. Thus, the reflected wave cannot be reduced. Therefore, the generated reflected wave returns to the first high frequency power device 50 side.

Further, since the reflected wave is generated owing to the phenomenon like a phenomenon that the first high frequency is modulated by the second frequency, the frequency components of the reflected wave include the first frequency as a main component and the second frequency as a spurious component mounted thereon. Accordingly, most of the frequency components of the reflected wave are occupied by the first frequency and the frequency in the neighborhood of the first frequency.

FIG. 10 shows one example of the simulation of the forward wave and the reflected wave detected in the output end of the first high frequency power device 50 having a higher output frequency when the two high frequency power devices having different output frequencies supply the high frequency power to the one load 5. The setting value of the forward wave power outputted from the first high frequency power device 50 is 3000 [W].

In FIG. 10, FIG. 10A shows the forward wave voltage in the output end of the first high frequency power device 50. FIG. 10B shows the reflected wave voltage in the output end of the first high frequency power device 50. FIG. 10C shows the frequency components in the vicinity of the first frequency of the frequency components of the forward wave voltage shown in FIG. 10A. FIG. 10D shows the frequency components in the vicinity of the first frequency of the frequency components of the reflected wave voltage shown in FIG. 10B.

As described above, when the plurality of high frequency power devices having the different output frequencies supply the high frequency power to the one load 5, for instance, the reflected wave voltage as shown in FIG. 10($b$) is generated in the high frequency power device side having the high output frequency. The reflected wave power at this time is about 950 [W] in a certain model. This shows a very large rate as high as about 30% of the output power.

Further, at this time, the influence thereof is given to the forward wave so that the forward wave voltage as shown in FIG. 10A is obtained.

Further, in such a case, the frequency components in the vicinity of the first frequency of the forward wave voltage and the reflected wave voltage are respectively shown in FIG. 10C and FIG. 10D. That is, in the case of an example shown in FIG. 10, it is understood that the first frequency substantially occupies the frequency components of the forward wave voltage. On the other hand, it is understood, as described above, that the frequency components of the reflected wave voltage include the first frequency as a main component and the second frequency as spurious component mounted thereon. As a result, as shown in FIG. 10B, the reflected voltage varies in the period t2 of the second frequency.

In the high frequency power device, the filter part 53 is ordinarily provided in the output side as shown in FIG. 7. However, since the filter part 53 is a low-pass filter for removing higher harmonics component to the first frequency as the main component, the filter part 53 cannot remove the frequency components in the vicinity of the first frequency. Accordingly, the filter part cannot remove the components of the second frequency mounted on the first frequency of the main component as the spurious part.

Consequently, the generated reflected wave passes through the filter of the first high frequency power device 50 to enter the high frequency power device 50, so that the reflected wave gives an adverse effect to the amplifying element in the high frequency power device. Further, since the generated reflected wave power reaches about 30% as high as the output as described above, the reflected wave has a large influence and may sometimes break the amplifying element in the high frequency power device.

On the other hand, when viewed from the second high frequency power device 6, the reflected wave having the frequency components of the first frequency returns to the high frequency power device side. However, since the filter provided in the high frequency power device is a low-pass filter for removing the higher harmonics to the second frequency as the main component, the filter can remove the frequency components of the first frequency. Accordingly, the second high frequency power device 6 side hardly receives the influence of the first frequency outputted from the first high frequency power device 50.

As described above, when the plurality of high frequency power devices having the different output frequencies supply the high frequency power to the one load 5, a problem arises that the high frequency power device having the high output frequency receives an adverse effect in the amplifying element therein owing to the reflected wave by the influence of the high frequency power device having the low output frequency.

SUMMARY OF THE INVENTION

The present invention is devised under the above-described circumstances and it is an object of an aspect of the present invention to provide a high frequency power device in which when the components of the output frequency of other high frequency power device different from an output frequency are included in a reflected wave, the level of the reflected wave is lowered to protect an amplifying element therein from the reflected wave.

An first aspect of the invention provides a high frequency power device for supplying high frequency power to a load to generate plasma, comprising:

a high frequency detector, detecting a forward wave voltage and a reflected wave voltage in an output end of the high frequency power device to output a forward wave signal corresponding to the forward wave voltage and a reflected wave signal corresponding to the reflected wave voltage;

a first oscillator, outputting a signal oscillated by a first predetermined frequency as a first oscillating signal;

a second oscillator, outputting a signal oscillated by a frequency within a second predetermined frequency band as a second oscillating signal;

a phase adjuster, adjusting a phase of the second oscillating signal outputted from the second oscillator;

a modulation index adjuster, adjusting a modulation index of the second oscillating signal outputted from the second oscillator;

a modulator, outputting a modulated signal obtained by modulating, infrequency, the first oscillating signal by the second oscillating signal whose phase and modulation index are adjusted by the phase adjuster and the modulation index adjuster respectively; and a high frequency output unit, amplifying and outputting the modulated signal outputted from the modulator or a signal obtained by controlling the output level of the modulated signal.

A second aspect of the invention is preferably characterized in that the phase adjuster is connected to a first operating part for manually adjusting the phase of the second oscillating signal and the modulating index adjuster is connected to a second operating part for manually adjusting the modulation index of the second oscillating signal.

A third aspect of the invention is preferably characterized in that the second oscillator includes a voltage control type oscillating part, inputting a component of the second predetermined frequency band of the forward wave signal outputted from the high frequency detector as an input signal A fourth aspect of the invention is preferably characterized in that the voltage control type oscillating part has a function of holding a state of the input signal such that when an amplitude level of the input signal is lower than a predetermined level, the amplitude level of the input signal reaches the predetermined level or higher.

A fifth aspect of the invention is preferably characterized in that the second oscillator includes an oscillator oscillating in the second predetermined frequency.

A sixth aspect of the invention is preferably characterized in that the high frequency power device further comprises a reflected wave power calculator, calculating a reflected wave power value based on the reflected wave signal outputted from the high frequency detector and outputting a reflected wave power signal.

A seventh aspect of the invention is preferably characterized in that the reflected wave power calculator is connected to a monitor.

A eighth aspect of the invention is preferably characterized in that the phase is adjusted based on the reflected wave power signal displayed on the monitor through a first operating part for manually adjusting the phase of the second oscillating signal.

A ninth aspect of the invention is preferably characterized in that the modulation index is adjusted based on the reflected wave power signal displayed on the monitor through a second operating part for manually adjusting the modulation index of the second oscillating signal.

According to the first aspect of the invention, since the frequency of the first oscillating signal is modulated by the second oscillating signal and the first oscillating signal whose frequency is modulated is outputted, an output wave form can be varied. A degree of variation can be changed by adjusting at least one of the phase and the modulation index of the second oscillating signal. Accordingly, when the reflected wave is generated, the reflected wave power can be reduced by adjusting the reflected wave so as to be cancelled. Consequently, a risk that the amplifying element forming the high frequency output unit is broken can be reduced. Further, since an element high in its voltage resistance or a temperature resistance does not need to be selected by considering the reflected wave, the element can be miniaturized and a cost can be lowered.

According to the first aspect of the present invention, even when the reflected wave is generated by the high frequency of other high frequency power device having the different output frequency, the reflected wave can be reduced by adjusting the phase and the modulation index.

Generally, when the state of the plasma of the load is stable, even if the reflected wave is generated due to the influence of the high frequency of other high frequency power device having the different output frequency, the state of the reflected wave is hardly changed. Therefore, when the phase and the modulation index of the oscillating signal as a modulating wave are adjusted once to reduce the reflected wave by the present invention, a state that the reflected wave is reduced can be maintained without frequently changing a degree of adjustment of the phase and the modulation index.

Thus, according to the second aspect of the invention, since the operating part for manually adjusting the phase and the modulation index is provided, the reflected wave can be simply reduced without requiring a complicated control.

According to the third aspect of the invention, since the oscillating signal synchronized with the output frequency of other high frequency power device can be designated as the modulated signal, an oscillating frequency may not be advantageously adjusted.

In the third aspect of the invention, the oscillating frequency does not need to be advantageously adjusted, however, the amplitude level of the second oscillating signal is lowered so that the second oscillating signal cannot be sometimes used as a signal for synchronization. In such a case, as in the fourth aspect of the invention, a function for maintaining a previous state is provided so that the effect of the third invention can be maintained.

According to the fifth aspect of the invention, though the output frequency of other high frequency power device cannot be synchronized with the frequency of the second oscillating signal, the filter or a circuit for holding the state are not necessary, so that a structure can be the more simplified.

According to the sixth aspect to the ninth aspect of the invention, since the high frequency power device further comprises a reflected wave power calculator, calculating a reflected wave power value based on the reflected wave signal outputted from the high frequency detector and outputting a reflected wave power signal, the phase and the modulation index are easily adjusted.

DETAILED DESCRIPTION OF THE INVENTION

Figure 1:
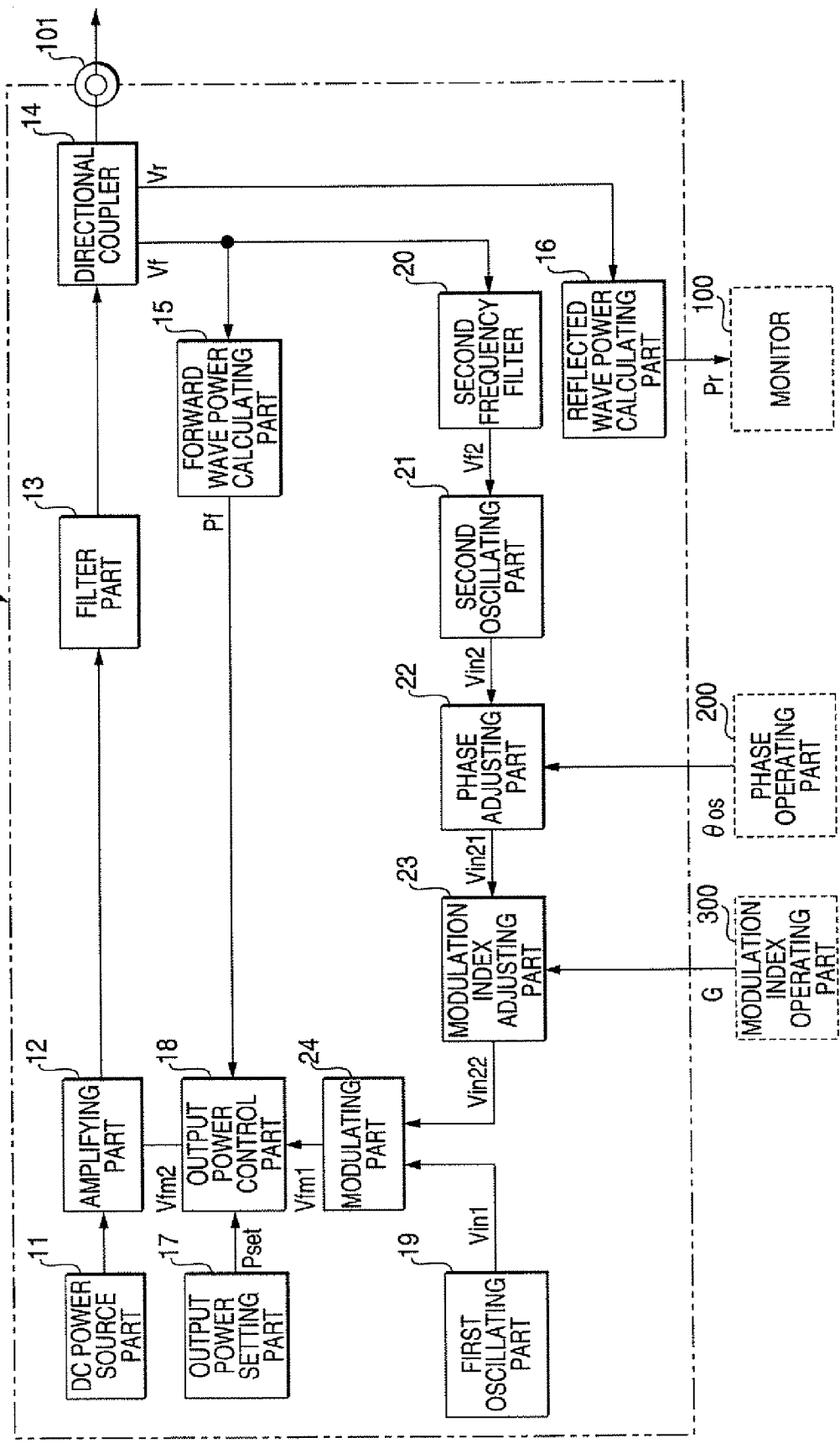
FIG. 1 is a block diagram showing the structure of a high frequency power device 1 according to the present invention.

Now, the detail of the present invention will be described below by referring to the drawings.

FIG. 1 is a block diagram showing the structure of a high frequency power device 1 according to the present invention.

The high frequency power device 1 includes, as shown in FIG. 1, a DC power source part 11, an amplifying part 12, a filter part 13, a directional coupler 14, a forward wave power calculating part 15, a reflected wave power calculating part 16, an output power setting part 17, an output power control part 18, a first oscillating part 19, a second frequency filter 20, a second oscillating part 21, a phase adjusting part 22, a modulation index adjusting part 23 and a modulating part 24. A first high frequency power outputted from the first high frequency power device 1 is designated by a first frequency f1, the output frequency of the first high frequency power device is designated as a first frequency f1 and the period of the first frequency is designated as t1.

The DC power source part 11 serves to supply DC power to a below-described amplifying part 12.

The amplifying part 12 uses a DC power supplied form the DC power source part 11 to amplify an oscillating signal Vfm2 outputted from a below-described output power control part 18 and outputs a high frequency power through an output end 101 of the high frequency power device. The high frequency power amplified in the amplifying part 12 is supplied to a load 5 through the filter part 13 and the directional coupler 14. The amplifying part 12 is formed with, for instance, an amplifying circuit of a push-pull system using an FET. The amplifying part 12 shows one example of a high frequency output unit of the present invention. A power outputted from the amplifying part 12 and supplied to the load 5 is referred to as a forward wave power and a power reflected from the load 5 side is referred to as a reflected wave power. Further, the voltage component of the forward wave power is referred to as a forward wave voltage and a current component is referred to as a forward wave current. Similarly, the voltage component of the reflected wave power is referred to as a reflected wave voltage and a current component is referred to as a reflected wave current.

The filter part 13 is a filter for removing higher harmonics.

The directional coupler 14 detects the forward wave voltage and the reflected wave voltage of the high frequency power (the forward wave power and the reflected wave power) in the output end of the high frequency power device 1 to output, as detecting signals, a forward wave voltage signal Vf corresponding to the forward wave voltage and a reflected wave voltage signal Vr corresponding to the reflected wave voltage. The directional coupler 14 shows one example of a high frequency detector of the present invention.

The forward wave power calculating part 15 calculates the forward wave power from the forward wave voltage signal Vf outputted from the directional coupler 14 and outputs the calculated forward wave power as a forward wave power signal Pf.

The reflected wave power calculating part 16 calculates the reflected wave power from the reflected wave voltage signal Vr outputted from the directional coupler 14 and outputs the calculated reflected wave power as a reflected wave power signal Pr. The reflected wave power signal Pr is supplied to a monitor 100 located outside the high frequency power device. The reflected wave power calculating part 16 shows one example of a reflected wave power calculator of the present invention.

The output power setting part 17 serves to set the output power value of the high frequency power supplied to the load 5. Though omitted in FIG. 1, in the output power setting part 17, an operating part is provided that has an output power setting switch for setting the output power setting value of the high frequency power or an output start switch for instructing the start of a supply of the high frequency power. The output power setting value Pset of the high frequency power set in the output power setting part 17 is supplied to the output power control part 18. The output power setting value or the like may be inputted from an external device.

The output power control part 18 compares the output power setting value Pset of the high frequency power set in the output power setting part 17 with the forward wave power signal Pf measured in the forward wave power calculating part 15 to control the output level of a modulated signal Vfm1 outputted from a below-described modulating part 24 and then output as a modulated signal Vfm2 so that the output power setting value Pset is equal to the forward wave power signal Pf. That is, the output power control part 18 serves to control the output level of the modulated signal Vfm1 so as to control the output of the high frequency power to be constant. The modulating part 24 will be described below.

In this embodiment, as described above, to control the output of the high frequency power device 1 is equal to control the forward wave power to be constant. However, the present invention is not limited thereto and a method for controlling a power in the load side to be constant may be employed.

The first oscillating part 19 outputs an ac oscillating signal Vin1 of the first frequency to the amplifying part 12. The first oscillating part 19 shows one example of a first oscillator of the present invention.

The second frequency filter 20 is a filter that receives the forward wave voltage signal Vf outputted from the directional coupler 14 as an input to take out the frequency component of the a second frequency included in the forward wave voltage signal Vf. The output of the filter is designated as a second forward wave voltage signal Vf2.

The second oscillating part 21 is a voltage control type oscillating circuit that receives the output of the second frequency filter 20 as an input to output a second oscillating signal Vin2 of a frequency synchronous with the frequency of the inputted second forward wave voltage signal Vf2. The second oscillating part 21 has a function for holding the state of the input signal and holding the state until the amplitude level of the input signal reaches a predetermined level or higher when the amplitude level of the input signal is lower than the predetermined level. The second oscillating part 21 shows one example of a second oscillator of the present invention.

The phase adjusting part 22 serves to adjust the phase of the second oscillating signal outputted from the second oscillating part 21. The phase adjusting part 22 is connected to a phase operating part 200 and has a function for adjusting the phase in accordance with a command signal θ os from an external part corresponding to a phase command value. The phase adjusting part 22 shows one example of a phase adjuster of the present invention.

The modulation index adjusting part 23 serves to adjust the modulation index of the second oscillating signal outputted from the second oscillating part 21. The modulation index adjusting part 23 is connected to a modulation index operating part 300 and has a function for adjusting the modulation index in accordance with a command signal G from an external part corresponding to a modulation index command value. The modulation index adjusting part 23 shows one example of a modulation index adjuster of the present invention.

The phase adjusting part 22 and the modulation index adjusting part 23 are adjustable respectively based on a command signal θ os and the command signal G in accordance with the reflected wave power signal Pr which is outputted from the reflected wave power calculating part 16 and then displayed on the monitor 100

In this embodiment, the modulation index adjusting part 23 is provided after the phase adjusting part 22, however, this order may be reversed. Further, in this specification, a signal to be adjusted by the phase adjusting part 22 is designated as the second oscillating signal outputted from the second oscillating part 21 irrespective of the order of the phase adjusting part 22 and the modulation index adjusting part 23, and a signal to be adjusted by the modulation index adjusting part 23 is designated as the second oscillating signal outputted from the second oscillating part 21. For instance, when the modulation index adjusting part 23 is provided after the phase adjusting part 22, the oscillating signal whose modulation index is to be adjusted by the modulation index adjusting part 23 precisely indicates the oscillating signal outputted from the phase adjusting part 22, however, for convenience sake, an expression that the phase of the second oscillating signal is adjusted is used.

The modulating part 24 serves to output the modulated signal Vfm1 obtained by modulating the frequency of the first oscillating signal by the second oscillating signal whose phase and modulation index are adjusted. The modulated signal Vfm1 can be expressed by a formula (1).

$$Vfm1 = A \cdot \cos(\omega 1 t + G \cdot \sin(\omega 2 t + \theta os)) \quad (1)$$

In this case. "ω1t" is a value obtained by multiplying the angular frequency 1 of the first oscillating signal by time t. "ω2t" is a value obtained by multiplying the angular frequency ω2 of the second oscillating signal by time t. "A" designates a constant determined by the amplitude level of the first oscillating signal. "θ os" designates a phase offset used when the phase is adjusted by the phase adjusting part 22. "G" designates a gain used when the modulation index is adjusted by the modulation index adjusting part 23. The modulating part 24 shows one example of a modulator of the present invention.

Namely, the amplitude of the output of the modulating part 24 has the amplitude level of the first oscillating signal, however, the oscillating frequency is modulated by not the frequency of the first oscillating signal but by the frequency of the second oscillating signal, so that the oscillating frequency varies. As described above, the modulated signal Vfm1 whose output level is controlled by the output power control part 18 is inputted to the amplifying part 12.

Now, an operation using the high frequency power device will be described below.

Figure 2:
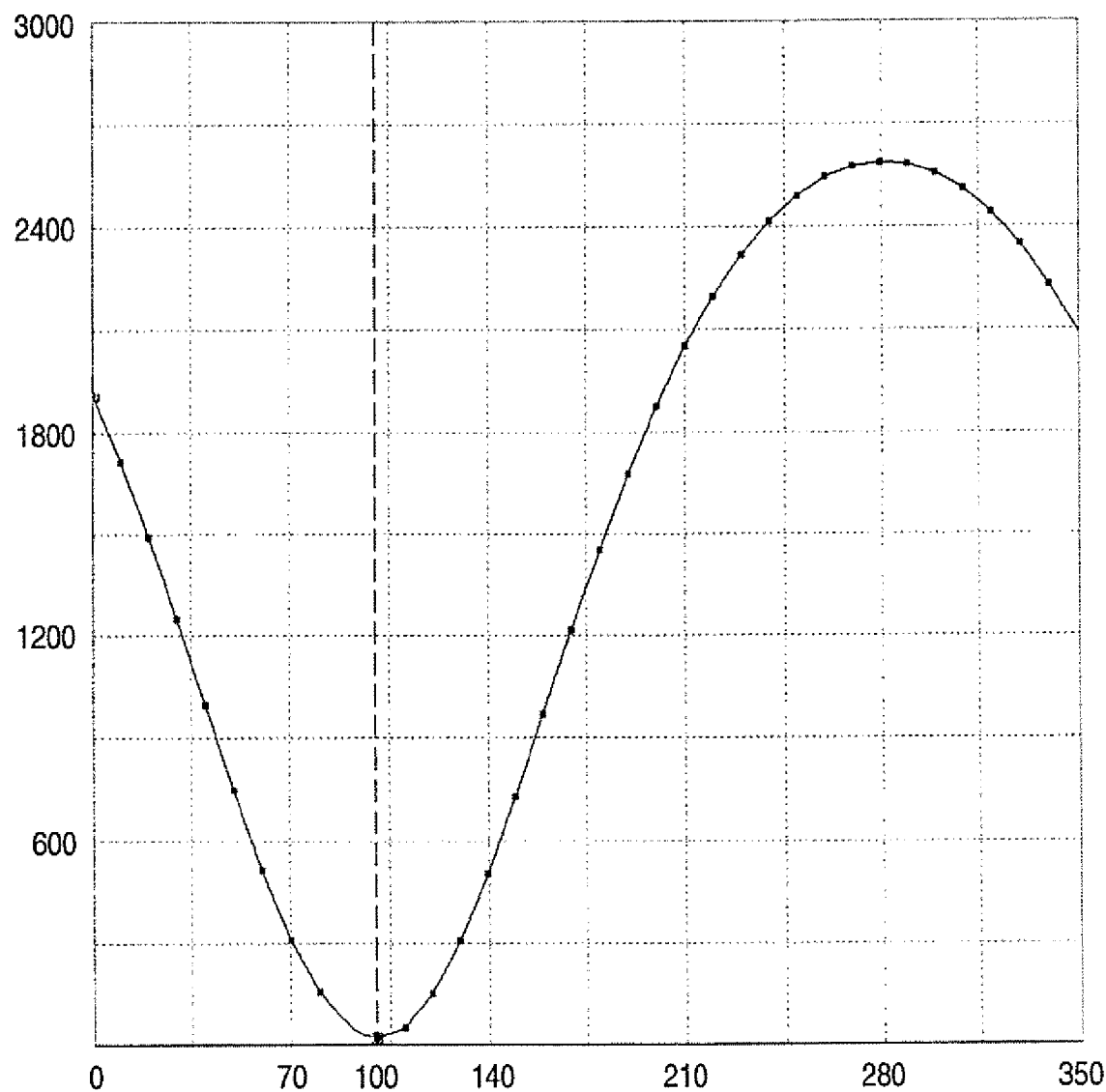
FIG. 2 is a simulation diagram showing a reflected wave power when a phase is changed in a phase adjusting part 22.

FIG. 2 is a simulation diagram showing the reflected wave power when the phase is changed in the phase adjusting part 22. The modulation index is set to 1. It is understood from the diagram that the reflected wave power can be reduced by adjusting the phase. In this example, when the phase is set to 100 degrees, the reflected wave power is about 20 [W] and minimum. Further, when the phase is set to 280 degrees, the reflected wave power is about 2590 [W] and maximum. In the case of a simulation diagram shown in FIG. 10, since the reflected wave power is about 950 [W], the reflected wave power can be greatly reduced by adjusting the phase.

The states of a forward wave and a reflected wave in the phase (100 degrees) where the reflected wave power becomes minimum and in the phase (280 degree) where the reflected wave power becomes maximum are shown in FIGS. 3 and 4.

FIGS. 3A to 3D show one example of a simulation of the forward wave and the reflected wave detected in the output end of the high frequency power device side high in its output frequency in the case of the phase (100 degrees) where the reflected wave power becomes minimum in FIG. 2.

FIGS. 4A to 4D show one example of a simulation of the forward wave and the reflected wave detected in the output end of the high frequency power device side high in its output frequency in the case of the phase (280 degree) where the reflected wave power becomes maximum in FIG. 2.

Both in FIGS. 3 and 4, the setting value of the forward wave power outputted from the high frequency power device is 3000 [W] as in FIG. 10. Further, in FIGS. 3 and 4, FIGS. 3A and 4A show the forward wave voltage in the output end of the high frequency power device. FIGS. 3B and 4B show the reflected wave voltage in the output end of the high frequency power device. FIGS. 3C and 4C show the frequency components in the vicinity of the first frequency of the frequency components of the forward wave voltage shown in FIGS. 3A and 4A. FIGS. 3D and 4D show the frequency components in the vicinity of the first frequency of the frequency components of the reflected wave voltage shown in FIGS. 3B and 4B.

Figure 3A:
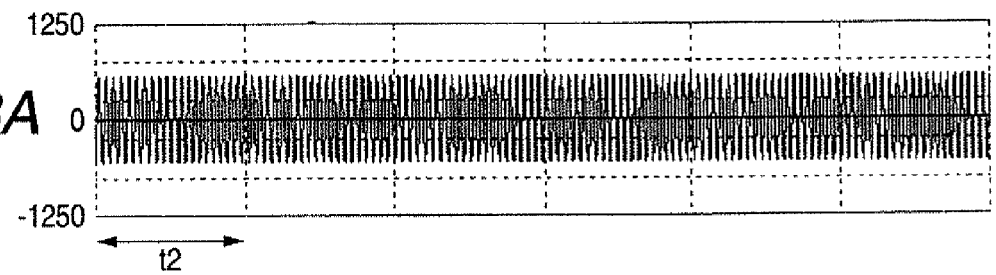
FIGS. 3A to 3D show one example of a simulation of a forward wave and a reflected wave detected in the output end of the high frequency power device side high in its output frequency in the case of the phase (100 degrees) where the reflected wave power becomes minimum in FIG. 2.
Figure 3B:
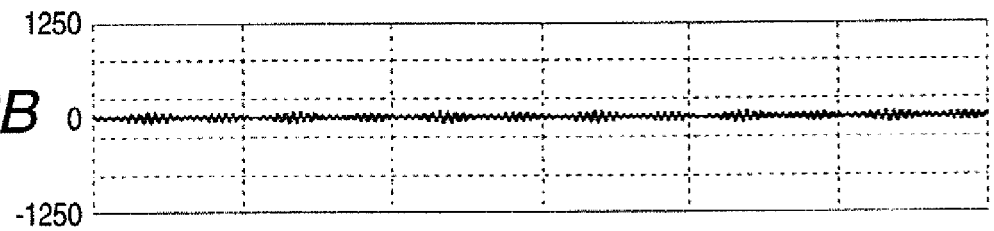
Figure 3C:
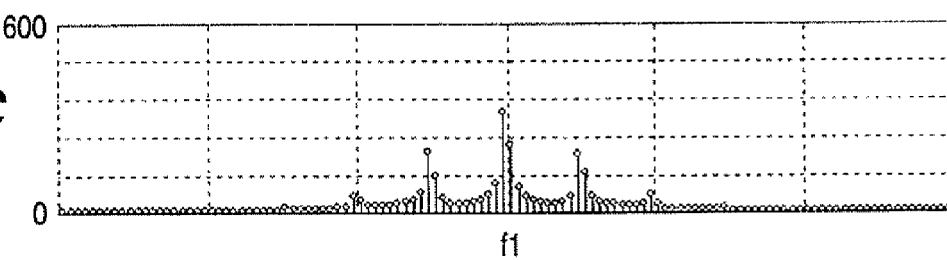
Figure 3D:
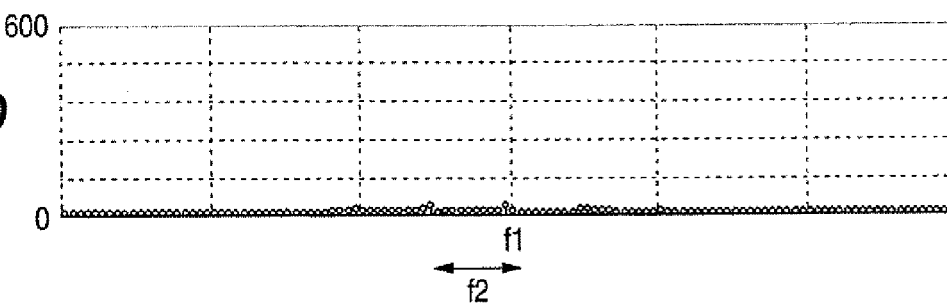
Figure 4A:
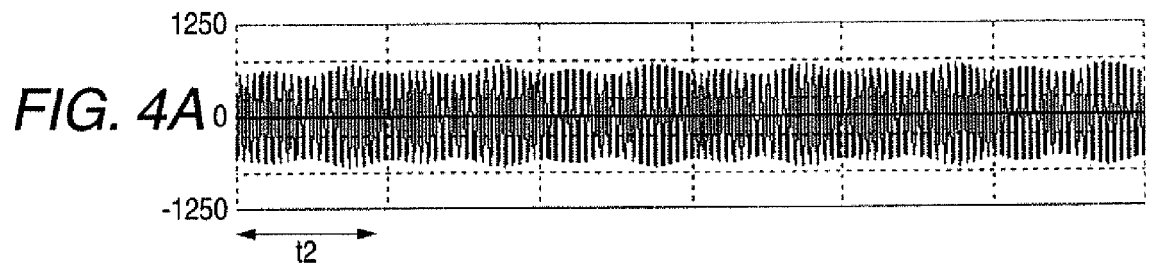
FIGS. 4A to 4D show one example of a simulation of the forward wave and the reflected wave detected in the output end of the high frequency power device side high in its output frequency in the case of the phase (280 degree) where the reflected wave power becomes maximum in FIG. 2.
Figure 4B:
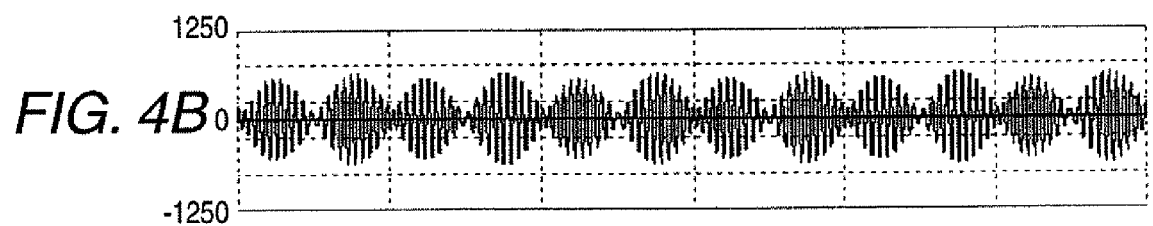
Figure 4C:
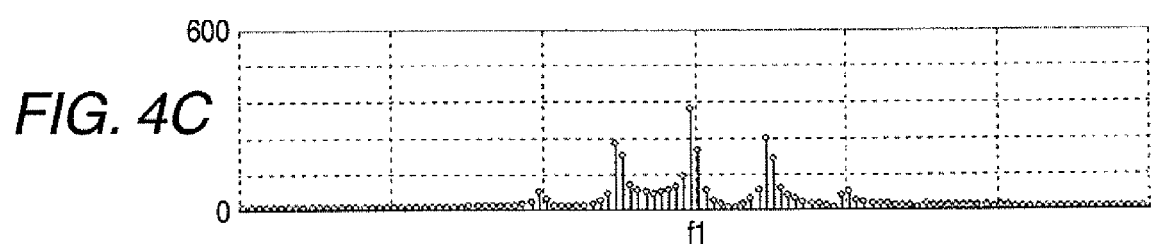
Figure 4D:
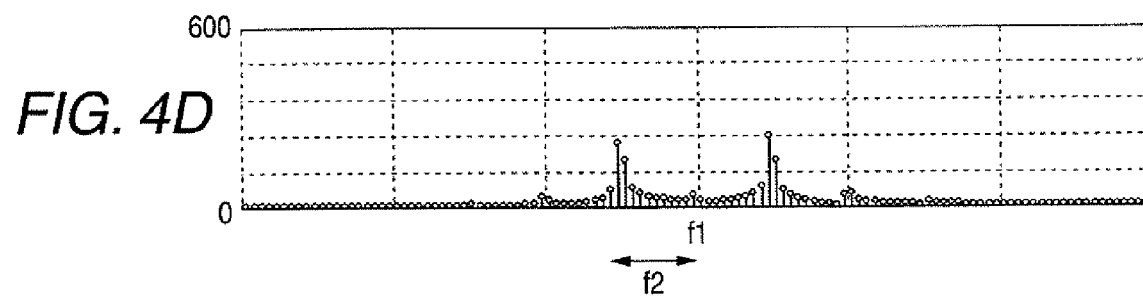

As described above, when the phase of the second oscillating signal is adjusted and the frequency of the first oscillating signal is modulated by the second oscillating signal, as shown in FIGS. 3C and 4C, the frequency components of the second oscillating signal are mounted on the forward wave as a spurious part. Therefore, as shown in FIGS. 3B and 4B and FIGS. 3D and 4D, the state of the reflected wave changes. At this time, as shown in FIG. 3, when the phase can be adjusted so as to cancel the reflected wave, the level of the reflected wave can be reduced.

Figure 5:
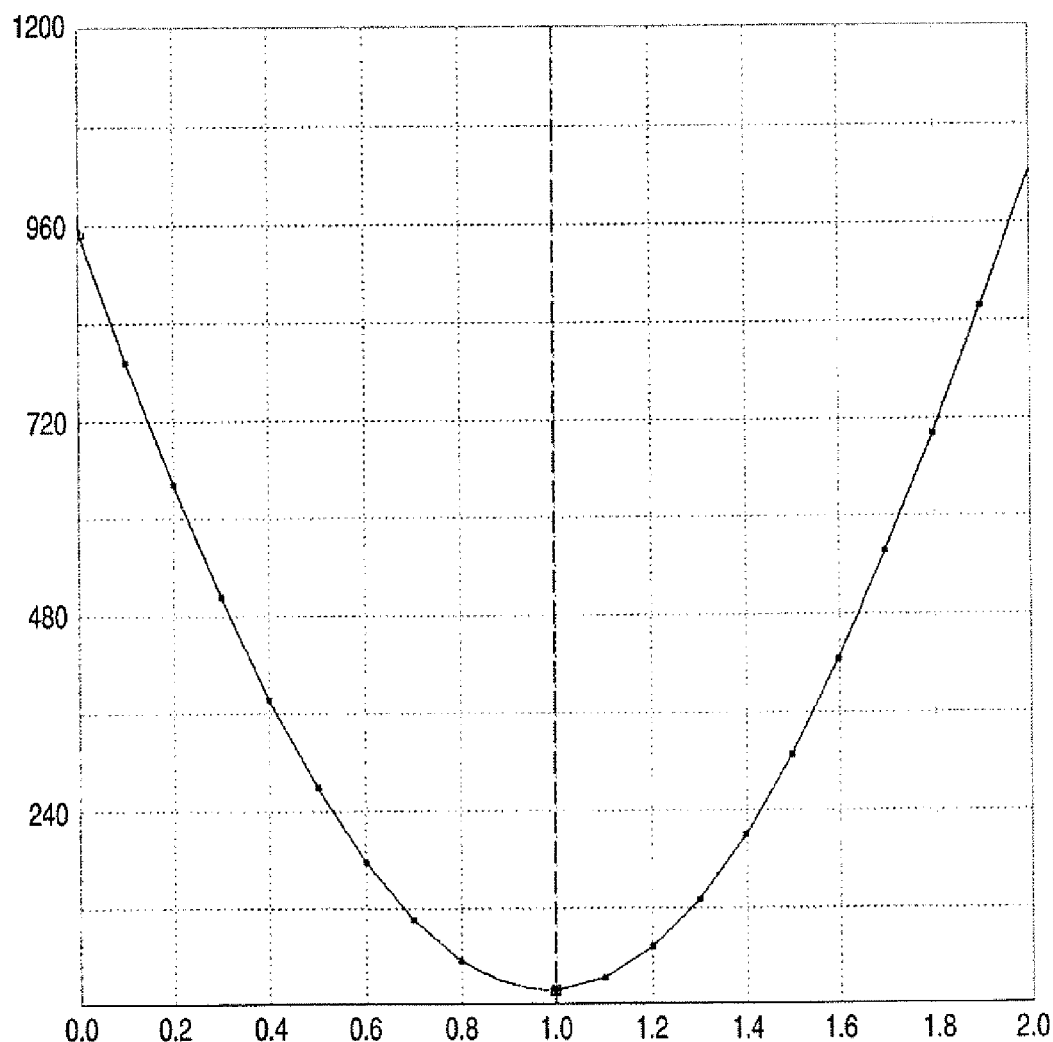
FIG. 5 is a simulation diagram showing the reflected wave power when a modulation index is changed in a modulation index adjusting part 23.
Figure 6:
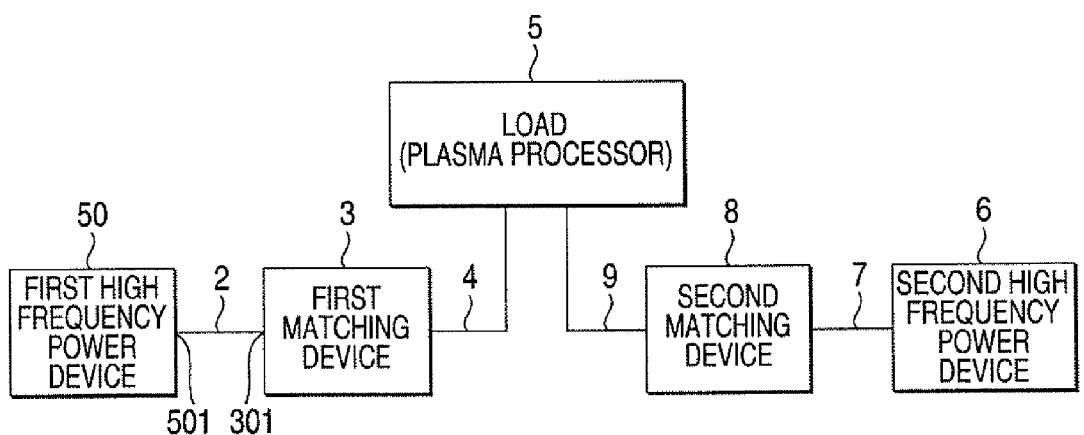
FIG. 6 is a block diagram showing the connecting relation of a plasma processing system using the high frequency power of different frequencies.
Figure 7:
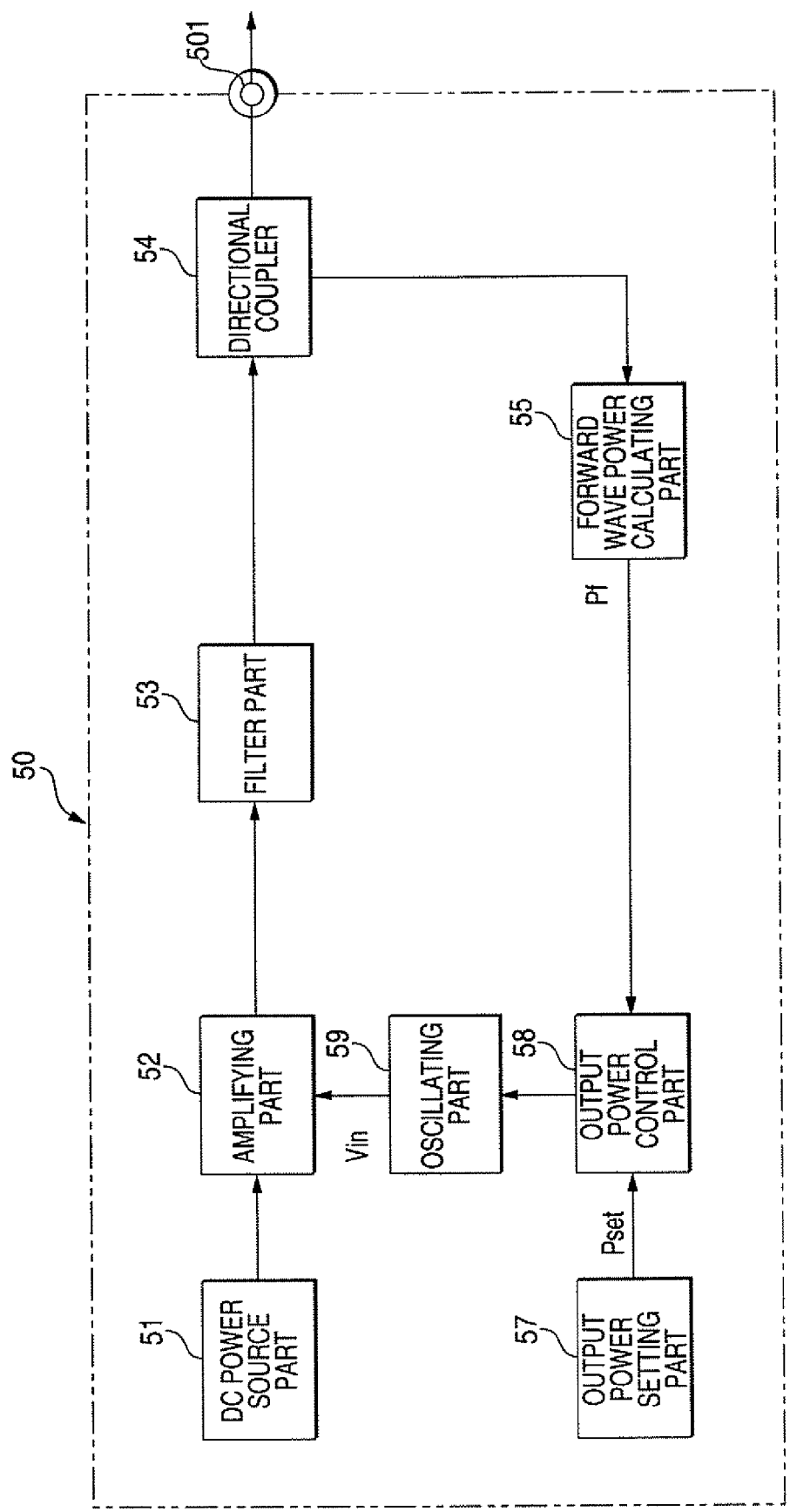
FIG. 7 is a block diagram showing a structural example of an ordinary high frequency power device.
Figure 8:
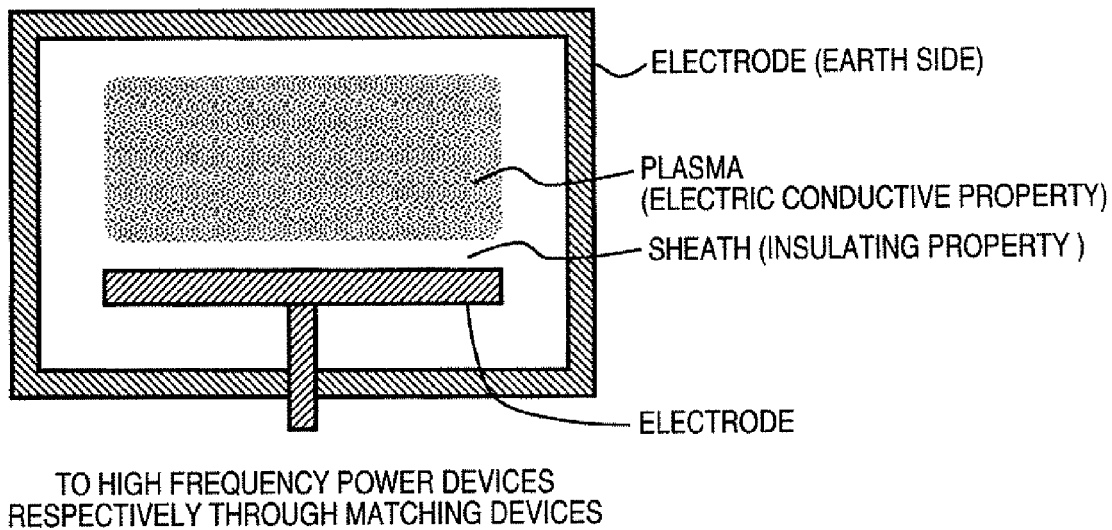
FIG. 8 is an image diagram when a plasma is generated in the chamber of a load 5.
Figure 9:
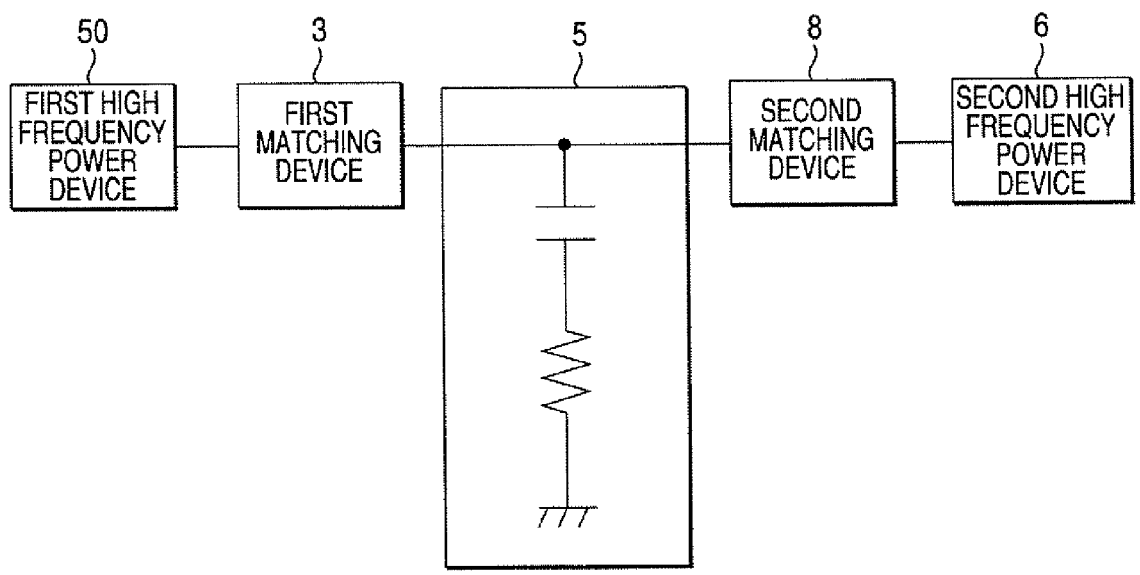
FIG. 9 shows an electric equivalent circuit of the load 5 when the plasma is generated in the chamber.
Figure 10A:
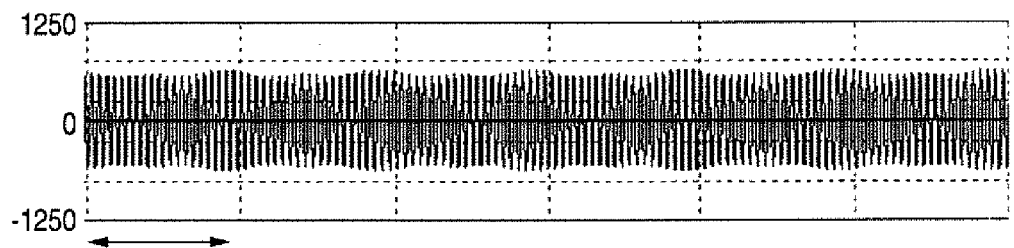
FIGS. 10A to 10D show one example of the simulation of a forward wave and a reflected wave detected in the output end of a first high frequency power device 50 having a higher output frequency when two high frequency power devices having different output frequencies supply the high frequency power to the one load 5.
Figure 10B:
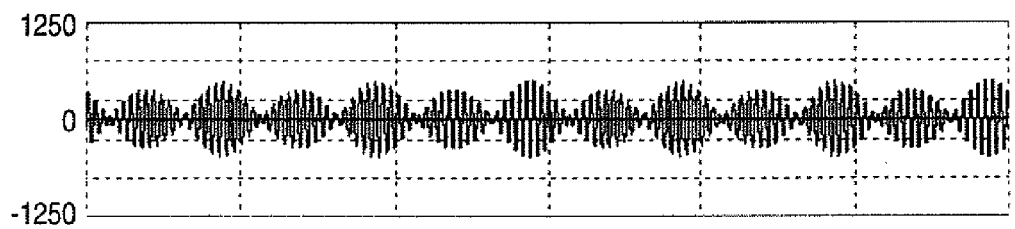
Figure 10C:
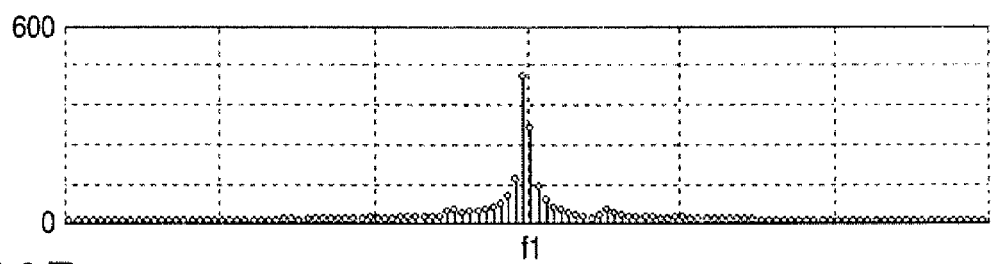
Figure 10D:
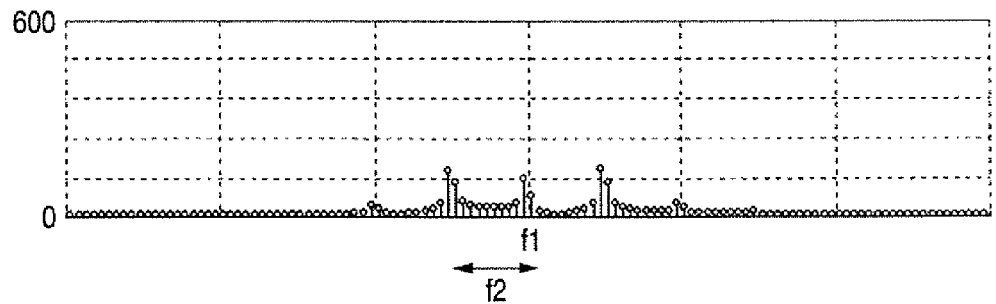

FIG. 5 is a simulation diagram showing the reflected wave power when the modulation index is changed in the modulation index adjusting part 23. The phase is set to 100 degrees and the modulation index is set to 0 to 2. As apparent from the diagram, the modulation index is adjusted so that the reflected wave power can be reduced. In this example, when the modulation index is set to 1, the reflected wave power is about 16 [W] and minimum. Further, when the modulation index is set to 2, the reflected wave power is 1033 [W] and maximum. In the simulation shown in FIG. 10, since the reflected wave power is about 950 [W], the reflected wave power can be greatly reduced also by adjusting the modulation index.

As described above, the reflected wave power can be reduced by adjusting the phase and the modulation index. FIGS. 2 and 5 show examples in which either the phase or the modulation index is adjusted, however, both the phase and the modulation index may be combined and adjusted.

Thus, in this embodiment, the phase adjusting part 22 and the modulation index adjusting part 23 are provided in a post-stage of a 2 MHz oscillating part so that the phase and the modulation index of an oscillating signal outputted from the 2 MHz oscillating part can be adjusted. Accordingly, even when the reflected wave is generated due to the influence of other high frequency power device, since the level of the reflected wave can be reduced, the amplifying element in the high frequency power device can be protected from the reflected wave.

In this embodiment, the frequency component of the second frequency included in the forward wave voltage signal Vf outputted from the directional coupler 14 is taken out by the second frequency filter 20 and the taken out second forward wave voltage signal Vf2 is inputted to the second oscillating part 21. Thus, the oscillating signal synchronized with the output frequency of other high frequency power device can be designated as the modulated signal. Accordingly, the oscillating frequency may not be advantageously adjusted.

However, the present invention is not limited thereto. For instance, the second oscillating part 21 may have a structure including an oscillator oscillated by a second predetermined frequency. In this case, the output frequency of other high frequency power device cannot be synchronized with the frequency of the second oscillating signal, however, a filter or a holding circuit may not be required.

What is claimed is:

1. A high frequency power device for supplying high frequency power to a load to generate plasma, comprising:
   a high frequency detector, detecting a forward wave voltage and a reflected wave voltage in an output end of the high frequency power device to output a forward wave signal corresponding to the forward wave voltage and a reflected wave signal corresponding to the reflected wave voltage;
   a first oscillator, outputting a signal oscillated by a first predetermined frequency as a first oscillating signal;
   a second oscillator, outputting a signal oscillated by a frequency within a second predetermined frequency band as a second oscillating signal;
   a phase adjuster, adjusting a phase of the second oscillating signal outputted from the second oscillator;
   a modulation index adjuster, adjusting a modulation index of the second oscillating signal outputted from the second oscillator;
   a modulator, outputting a modulated signal obtained by modulating, in frequency, the first oscillating signal by the second oscillating signal whose phase and modulation index are adjusted by the phase adjuster and the modulation index adjuster respectively; and
   a high frequency output unit, amplifying and outputting the modulated signal outputted from the modulator or a signal obtained by controlling the output level of the modulated signal.

2. The high frequency power device according to claim 1, wherein the phase adjuster is connected to a first operating part for manually adjusting the phase of the second oscillating signal and the modulating index adjuster is connected to a second operating part for manually adjusting the modulation index of the second oscillating signal.

3. The high frequency power device according to claim 1, wherein the second oscillator includes a voltage control type oscillating part, inputting a component of the second predetermined frequency band of the forward wave signal outputted from the high frequency detector as an input signal.

4. The high frequency power device according to claim 3, wherein the voltage control type oscillating part has a function of holding a state of the input signal such that when an amplitude level of the input signal is lower than a predetermined level, the amplitude level of the input signal reaches the predetermined level or higher.

5. The high frequency power device according to claim 1, wherein the second oscillator includes an oscillator oscillating in the second predetermined frequency.

6. The high frequency power device according to claim 1, further comprising a reflected wave power calculator, calculating a reflected wave power value based on the reflected wave signal outputted from the high frequency detector and outputting a reflected wave power signal.

7. The high frequency power device according to claim 6, wherein the reflected wave power calculator is connected to a monitor.

8. The high frequency power device according to claim 7, wherein the phase is adjusted based on the reflected wave power signal displayed on the monitor through a first operating part for manually adjusting the phase of the second oscillating signal.

9. The high frequency power device according to claim 7, wherein the modulation index is adjusted based on the reflected wave power signal displayed on the monitor through a second operating part for manually adjusting the modulation index of the second oscillating signal.

* * * * *